US 11,432,446 B2

(12) United States Patent
Ishikawa

(10) Patent No.: US 11,432,446 B2
(45) Date of Patent: Aug. 30, 2022

(54) ELECTRONIC COMPONENT MOUNTING MACHINE AND ELECTRONIC COMPONENT MOUNTING METHOD

(71) Applicant: FUJI CORPORATION, Chiryu (JP)

(72) Inventor: Kenzo Ishikawa, Kariya (JP)

(73) Assignee: FUJI CORPORATION, Chiryu (JP)

( * ) Notice: Subject to any disclaimer, the term of this patent is extended or adjusted under 35 U.S.C. 154(b) by 268 days.

(21) Appl. No.: 16/757,530

(22) PCT Filed: Nov. 22, 2017

(86) PCT No.: PCT/JP2017/042032
§ 371 (c)(1),
(2) Date: Apr. 20, 2020

(87) PCT Pub. No.: WO2019/102550
PCT Pub. Date: May 31, 2019

(65) Prior Publication Data
US 2021/0195815 A1 Jun. 24, 2021

(51) Int. Cl.
*H05K 13/04* (2006.01)
(52) U.S. Cl.
CPC ......... *H05K 13/0413* (2013.01); *H05K 13/04* (2013.01); *H05K 13/0409* (2018.08)
(58) Field of Classification Search
CPC .................................................. H05K 13/0409
See application file for complete search history.

(56) References Cited

U.S. PATENT DOCUMENTS

| | | | | |
|---|---|---|---|---|
| 5,285,946 A | * | 2/1994 | Tomigashi | H05K 13/0409 228/9 |
| 5,523,642 A | * | 6/1996 | Hashimoto | G01L 1/16 310/326 |
| 2016/0037694 A1 | * | 2/2016 | Kawaguchi | H05K 13/082 29/739 |

FOREIGN PATENT DOCUMENTS

| | | | |
|---|---|---|---|
| EP | 2 760 264 A1 | 7/2014 | |
| EP | 3 082 390 A1 | 10/2016 | |
| EP | 3082390 A1 * | 10/2016 | ............... G01L 1/16 |
| JP | 2006-196618 A | 7/2006 | |

OTHER PUBLICATIONS

International Search Report dated Feb. 27, 2018 in PCT/JP2017/042032 filed on Nov. 22, 2017, 2 pages.

* cited by examiner

*Primary Examiner* — Gerald McClain
(74) *Attorney, Agent, or Firm* — Oblon, McClelland, Maier & Neustadt, L.L.P.

(57) ABSTRACT

A holder including syringe configured to move up and down as the lifting and lowering section moves up and down, a first displacement portion configured to move up and down with respect to the syringe and to which the component holding section is attached, and a second displacement portion provided separately from the first displacement portion and configured to move up and down with respect to the syringe and the first displacement portion. The second displacement portion includes an engaging portion configured to engage the first displacement portion urged downward by the first urging portion in a vertical direction, and a target detection portion coupled to the engaging portion and positioned above the syringe. The contact determination section determines that an electronic component has con- (Continued)

tacted the circuit board when displacement of the target detection portion is detected with the sensor.

4 Claims, 5 Drawing Sheets

ELECTRONIC COMPONENT MOUNTING MACHINE AND ELECTRONIC COMPONENT MOUNTING METHOD

TECHNICAL FIELD

The present application relates to an electronic component mounting machine and an electronic component mounting method.

BACKGROUND ART

Patent Literature 1 discloses an electronic component mounting machine provided with a sensor (contact-detecting sensor) for detecting when an electronic component has come in contact with a circuit board when the electronic component held by a suction head (component holding section) is mounted on the circuit board. In the conventional electronic component mounting machine described in Patent Literature 1, when the suction head is lowered while the electronic component held by the suction head is in a state of contacting with the circuit board, the suction head is displaced downward relative to the nozzle body (i.e., the head main body). In the conventional electronic component mounting machine, when a relative displacement of the mounting head with respect to the nozzle body is detected by a sensor, it is determined that the electronic component has come in contact with the circuit board.

PATENT LITERATURE

Patent Literature 1: JP-A-2006-196618

BRIEF SUMMARY

Technical Problem

However, in the technique described in Patent Literature 1, the sensor moves up and down together with the nozzle body. The conventional electronic component mounting machine determines that the electronic component has come in contact with the circuit board when the upper end of the suction head positioned below the sensor has moved to the same height as the sensor. In other words, since the sensor is disposed at a position close to the circuit board while the electronic component is in contact with the circuit board, it is necessary to avoid interference between components previously mounted on the circuit board and the sensor. Therefore, many restrictions are placed on control when the electronic component is mounted on the circuit board, making the mounting work of the electronic component inefficient.

It is an object of the present specification to provide an electronic component mounting machine and an electronic component mounting method capable of efficiently mounting an electronic component to a circuit board.

Solution to Problem

The present specification discloses an electronic component mounting machine for picking up supplied electronic components and mounting the electronic components on a conveyed circuit board. The electronic component mounting machine comprises: a head main body, a lifting and lowering section configured to move up and down with respect to the head main body, a holder configured to move up and down with respect to the head main body as the lifting and lowering section moves up and down, a component holding section that is attached to the holder and can hold the electronic component, and a contact determination section for determining whether the electronic component, being held by the component holding section, has come in contact with the circuit board. The holder comprises: a syringe configured to move up and down as the lifting and lowering section moves up and down; a first displacement portion configured to move up and down with respect to the syringe and to which the component holding section is attached, and a first urging portion configured to urge the first displacement portion downward with respect to the syringe. A second displacement portion comprises: an engaging portion configured to engage the first displacement portion urged downward by the first urging portion in a vertical direction, and a target detection portion coupled to the engaging portion and positioned above the syringe. The contact determination section comprises: a contact-detecting sensor disposed above the component holding section configured to detect displacement of the target detection portion with respect to the syringe, and the contact determination section determines that an electronic component has contacted the circuit board when displacement of the target detection portion is detected with the contact-detecting sensor.

Further, the present specification discloses an electronic component mounting method using an electronic component mounting machine for picking up supplied electronic components and mounting the electronic components on a conveyed circuit board. The electronic component mounting machine comprises: a head main body, a lifting and lowering section configured to move up and down with respect to the head main body, a holder configured to move up and down with respect to the head main body as the lifting and lowering section moves up and down, a component holding section that is attached to the holder and can hold the electronic component, and a contact-detecting sensor which is disposed above the component holding section. The holder comprises: a syringe configured to move up and down as the lifting and lowering section moves up and down; a first displacement portion configured to move up and down with respect to the syringe and to which the component holding section is attached, and a first urging portion configured to urge the first displacement portion downward with respect to the syringe. A second displacement portion comprises: an engaging portion configured to engage the first displacement portion urged downward by the first urging portion in a vertical direction, and a target detection portion coupled to the engaging portion and positioned above the syringe. The electronic component mounting method determines that the electronic component has come in contact with the circuit board when the contact-detecting sensor detects displacement of the target detection portion with respect to the syringe.

Advantageous Effects

With the electronic component mounting machine of the present disclosure, the target detection portion is positioned above the syringe, and the contact-detecting sensor is disposed above the component holding section. The contact determination section determines that the electronic component has contacted the circuit board when the displacement of the target detection portion is detected by the contact-detecting sensor. In this case, since the electronic component mounting machine can position the contact-detecting sensor at a position higher than the electronic component mounted on the board first, it is possible to eliminate the need to control interference between the electronic component mounted on the board first and the contact-detecting sensor and thereby efficiently perform the mounting operation of the electronic component.

The second displacement portion is provided separately from first displacement portion. On the other hand, the first displacement portion is urged downward with respect to the syringe by the first urging portion, and the second displacement portion is urged upward with respect to the syringe by the second urging portion. Therefore, when the syringe is moved up and down while the electronic component held by the component holding section is not in contact with the circuit board, the first displacement portion and the second displacement portion are integrally displaced in the vertical direction as the syringe is moved up and down. On the other hand, when the electronic component held by the component holding section comes into contact with the circuit board, the second displacement portion is displaced downward with respect to the first displacement portion. As a result, the holder can prevent a load caused by the mass of the second displacement portion from being applied to the electronic component when the electronic component held by the component holding section contacts the circuit board. Therefore, even when the second displacement portion becomes large by positioning the target detection portion above the syringe, the holder can suppress the electronic component from being damaged by the impact applied to the electronic component at the time of contact with the circuit board.

With the electronic component mounting method of the present disclosure, the target detection portion is positioned above the syringe, and the contact-detecting sensor is disposed above the component holding section. The electronic component mounting method determines that the electronic component is in contact with the circuit board when the displacement of the target detection portion is detected. In this case, the electronic component mounting machine can arrange the contact-detecting sensor at a position higher than that of the electronic component which is mounted on the board first. Therefore, in the electronic component mounting method, it is not necessary to manage interference between the electronic component previously mounted on the board and the contact-detecting sensor, thereby enabling the mounting operation of the electronic component to be performed efficiently.

DESCRIPTION OF EMBODIMENTS

1. Outer Appearance of the Configuration of Electronic Component Mounting Machine 1 Hereinafter, each embodiment to which the electronic component mounting machine and the electronic component mounting method disclosed in this specification are applied will be described with reference to the drawings. First, with reference to FIGS. 1 and 2, an external configuration of electronic component mounting machine 1 of one embodiment will be described.

Figure 1:
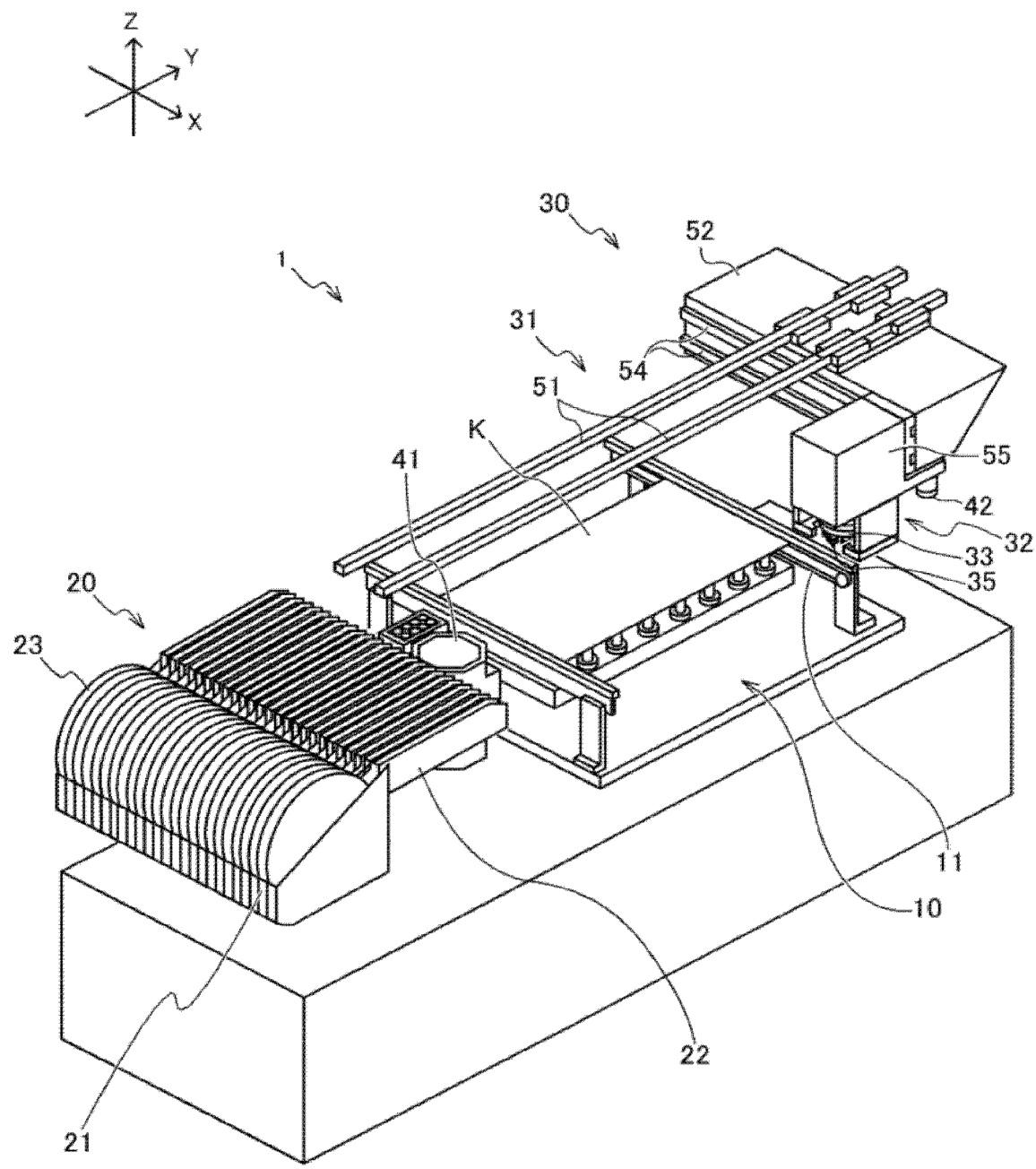
FIG. 1 A perspective view of an electronic component mounting machine according to an embodiment of the present specification.
Figure 3:
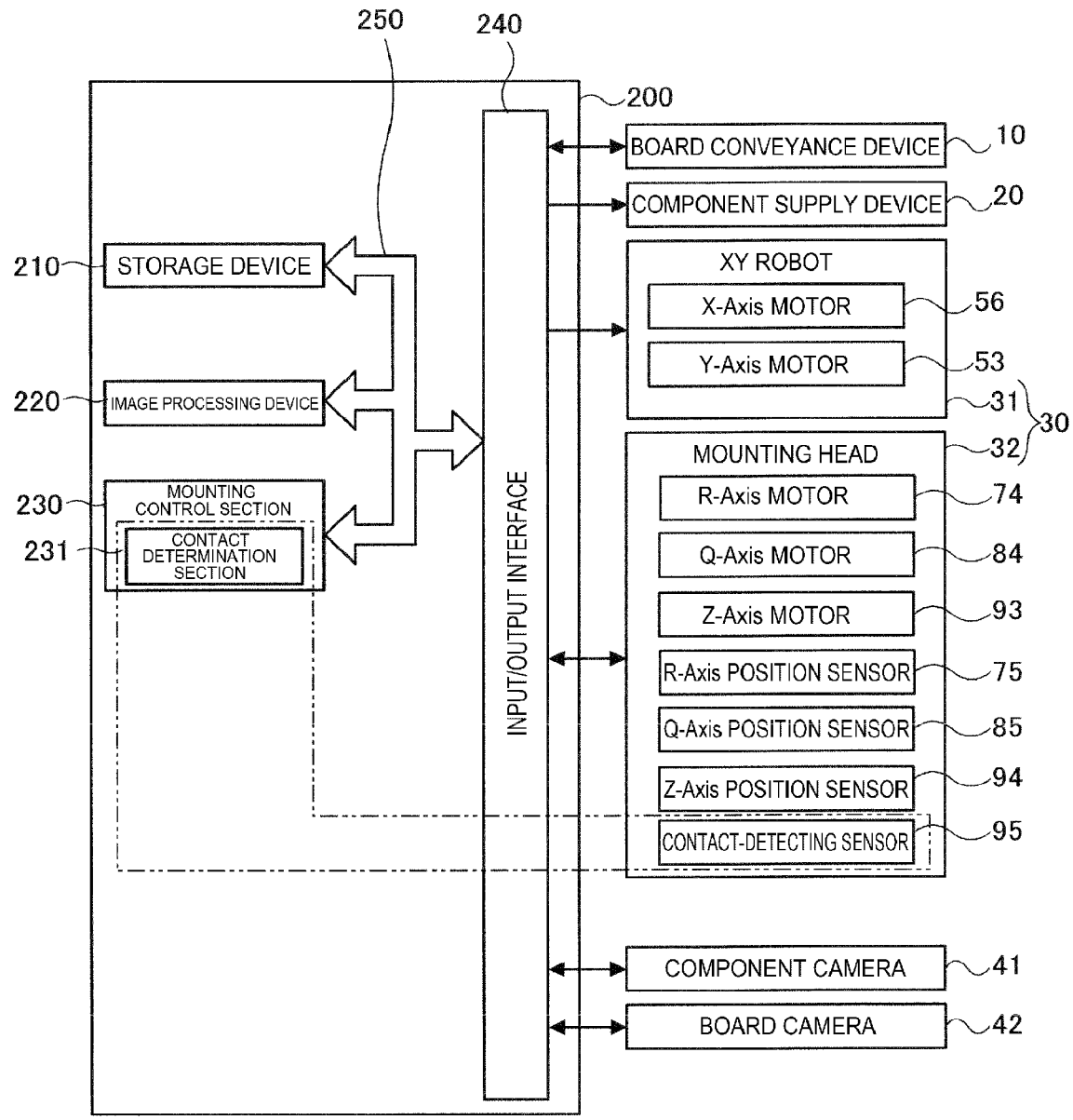
FIG. 3 A block diagram of a control device.

As shown in FIG. 1, component mounting machine 1 is mainly composed of board conveyance device 10, component supply device 20, component transfer device 30, component camera 41, board camera 42, and control device 200 (see FIG. 3). In the following description, the left-right direction of component mounting device 1 is defined as the X-axis direction, the front-rear direction is defined as the Y-axis direction, and the vertical direction is defined as the Z-axis direction.

Board conveyance device 10 is composed of a pair of belt conveyors 11 and the like spanning the X-axis direction. Board conveyance device 10 sequentially conveys loaded circuit board K (hereinafter referred to as "board K") in the X-axis direction, and positions board K conveyed to a predetermined position. When the mounting of electronic component P (hereinafter referred to as "component P") on the positioned board K is completed, board conveyance device 10 conveys out board K to the outside of component mounting machine 1.

Component supply device 20 supplies component P to be mounted on board K. Component supply device 20 includes multiple slots 21 arranged in the X-axis direction and multiple feeders 22 that are set in each of multiple slots 21 in an exchangeable manner. Feeder 22 feeds and moves carrier tape wound on reel 23 and supplies component P accommodated in the carrier tape to a component supply position provided at the distal end of feeder 22 (in the upper right side in FIG. 1).

Component transfer device 30 picks up component P supplied by component supply device 20 and attaches the picked-up component P to the positioned board K. Component transfer device 30 mainly consists of XY robot 31 and mounting head 32.

XY robot 31 is a head driving device that moves mounting head 32 in a direction intersecting the vertical direction (i.e., the X-axis direction and the Y-axis direction). XY robot 31 includes a pair of Y-axis guide rails 51, Y-axis slider 52, Y-axis motor 53 (refer to FIG. 3), a pair of X-axis guide rails 54, X-axis slider 55, and X-axis motor 56 (refer to FIG. 3). The pair of Y-axis guide rails 51 are long members extending in parallel in the Y-axis direction. Y-axis slider 52 is suspended by a pair of Y-axis guide rails 51 and is movable in the Y-axis direction by being driven by Y-axis motor 53. The pair of X-axis guide rails 54 are long members extending in parallel in the X-axis direction. X-axis slider 55 is attached to a pair of X-axis guide rails 54 and moves in the X-axis direction by being driven by X-axis motor 56. Mounting head 32 is detachably provided to X-axis slider 55 and is configured to hold component P supplied to the component supply position. A detailed configuration of mounting head 32 will be described later.

Component camera 41 and board camera 42 are digital image pickup devices having image pickup devices such as a CCD (Charge Coupled Device) and a CMOS (Complementary Metal Oxide Semiconductor). Component camera 41 and board camera 42 perform imaging within a range that falls within the visual field thereof based on a control signal from control device 200, to which component camera 41 and board camera 42 are connected for communication, and transmit image data obtained by imaging to control device 200. Component camera 41 is fixed to a base of component mounter 1 so that the optical axis thereof is directed in the Z-axis direction and images component P held by mounting head 32 from below. Board camera 42 is fixed to X-axis slider 55 so that the optical axis thereof is directed in the Z-axis direction, and images board K from above.

2. Configuration of Mounting Head 32

Figure 2:
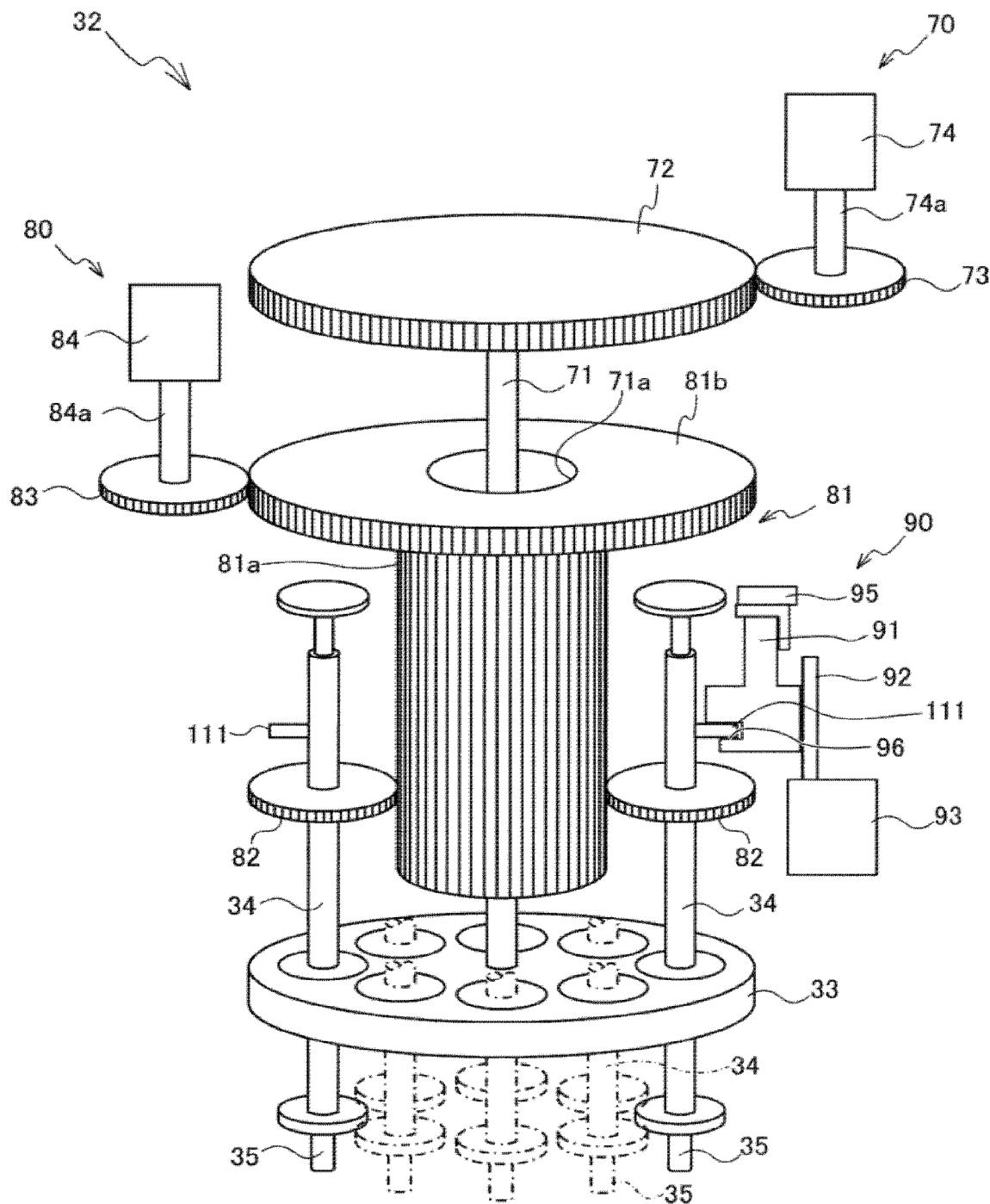
FIG. 2 A diagram showing a configuration of a mounting head.

Next, the configuration of mounting head 32 will be described with reference to FIG. 2. As shown in FIG. 2, mounting head 32 mainly consists of head main body 33, eight holders 34, eight component holding sections 35, R-axis driving device 70, Q-axis driving device 80, and Z-axis driving device 90. In FIG. 2, in order to simplify the drawing, two holders 34 out of the eight holders 34 are shown in solid lines, and only a portion of the other holders 34 are shown in dashed-dotted lines. Further, in FIG. 2, two component holding section 35 of the eight parts holding section 35 are shown in solid lines, and the other component holding sections 35 are shown in dashed-dotted lines.

Head main body 33 is a rotary head which is indexed to multiple indexing angles by rotating about the R-axis, which is parallel to the Z-axis direction. Since head main body 33 is detachably mounted to X-axis slider 55 of XY robot 31, the versatility of head main body 33 can be enhanced. Eight holders 34 and eight component holding sections 35 are arranged in a circumferential direction centered at the R-axis, and eight component holding sections 35 are detachably attached to the respective lower ends of eight holders 34. Head main body 33 moves between the component supply position and board K, and component holding section 35 holds component P supplied to the component supply position by suction. A detailed configuration of holder 34 will be described later.

Figure 4:
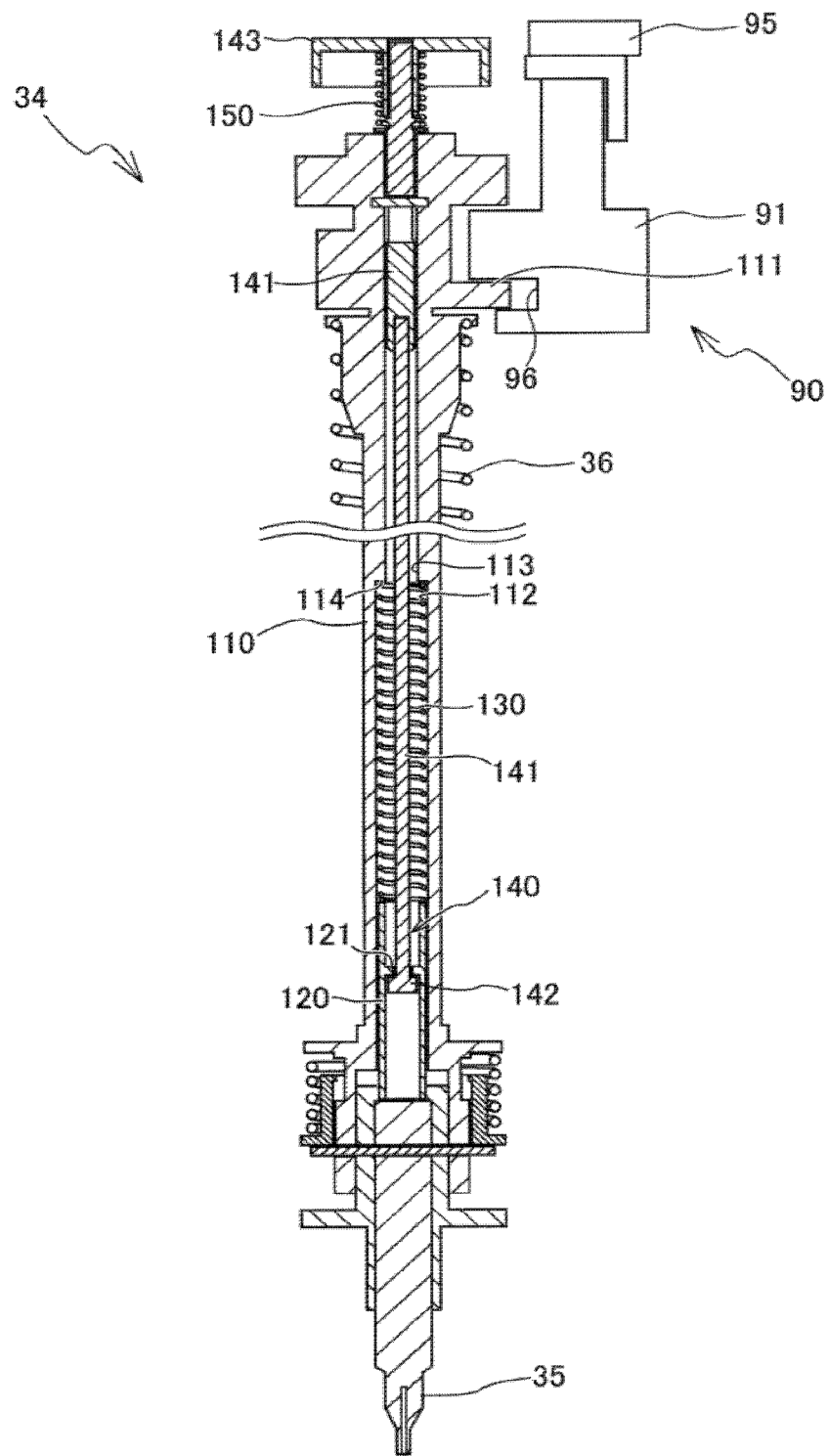
FIG. 4 A diagram showing an internal configuration of a holder.

Each holder 34 is supported so as to be movable up and down with respect to head main body 33, and each holder 34 is inserted into respective springs 36 (see FIG. 4). Spring 36 urges holder 34 upward with respect to head main body 33. Each holder 34 is provided with engagement piece 111 extending radially outward as viewed from the R-axis direction. Holder 34 and component holding section 35 are lowered by engagement piece 111 being pushed down against the urging force of spring 36. When engagement piece 111 is released from being pushed down, holder 34 and component holding section 35 which are pushed down are lifted up by the urging force of spring 36.

R-axis driving device 70 causes component holding sections 35 to revolve around the R-axis by rotating head main body 33 around the R-axis. R-axis driving device 70 includes R-axis member 71, R-axis driven gear 72, R-axis driving gear 73, R-axis motor 74, and R-axis position sensor 75 (see FIG. 3).

R-axis member 71 is a shaft member disposed coaxially with the R-axis. Head main body 33 is fixed to the lower end of R-axis member 71, and head main body 33 rotates around the R-axis together with the rotation of R-axis member 71. R-axis driven gear 72 is a gear fixed to the upper end of R-axis member 71, and R-axis driving gear 73 is a gear engaging with R-axis driven gear 72. R-axis motor 74 is a motor for providing a driving force for rotating R-axis driving gear 73, and R-axis driving gear 73 is connected to drive shaft 74a of R-axis motor 74 so as to rotate together with drive shaft 74a. R-axis position sensor 75 detects the rotational position of R-axis motor 74.

That is, the driving force of R-axis motor 74 is transmitted to head main body 33 via R-axis drive gear 73, R-axis driven gear 72, and R-axis member 71. In this manner, R-axis driving device 70 rotates head main body 33 around the R-axis by transmitting the driving force of R-axis motor 74 to head main body 33.

The Q-axis driving device 80 rotates all component holding sections 35 around the Q-axis in a synchronized manner. Q-axis drive device 80 includes Q-axis driven gear 81, eight nozzle gears 82, Q-axis driving gear 83, Q-axis motor 84, and Q-axis position sensor 85 (refer to FIG. 3).

Q-axis driven gear 81 is a stepped gear in which small gear 81a and large gear 81b having different outer diameters are connected so as to rotate together. Insertion hole 71a, through which R-axis member 71 is inserted, is formed through Q-axis driven gear 81, and Q-axis driven gear 81 is disposed concentrically with R-axis member 71 and rotatable relative to R-axis member 71.

Nozzle gear 82 is a gear that engages with small gear 81a of Q-axis driven gear 81, small gear 81a being a gear having a small outer diameter. Small gear 81a has a larger length in the axial direction than nozzle gears 82, and nozzle gears 82 slide in the Z-axis direction while kept engaged with small gear 81a. Eight nozzle gears 82 are individually fixed to eight holders 34 one by one so as to rotate together.

Q-axis driving gear 83 is a gear that engages with large gear 81b of Q-axis driven gear 81, large gear 81b being a gear having a large outer diameter. Q-axis motor 84 is a motor for providing a driving force for rotating Q-axis driving gear 83. Q-axis driving gear 83 is coupled to drive shaft 84a of Q-axis motor 84 so as to rotate together with drive shaft 84a. Q-axis position sensor 85 detects the rotational position of Q-axis motor 84.

That is, the driving force of Q-axis motor 84 is transmitted to holders 34 via R-axis drive gear 83, R-axis driven gear 81, and nozzle gear 82. In this way, Q-axis driving device 80 rotates component holding sections 35 by transmitting the driving force of Q-axis motor 84 to holders 34.

Z-axis driving device 90 lifts and lowers holder 34 in the Z-axis direction. Z-axis driving device 90 has lifting and lowering section 91, ball screw 92, Z-axis motor 93, and Z-axis position sensor 94. Lifting and lowering section 91 is provided so as to move up and down with respect to head main body 33. More specifically, lifting and lowering section 91 is attached to ball screw 92 provided in head main body 33, lifting and lowering section 91 moves up and down in the Z-axis direction by ball screw 92 being rotated via driving by Z-axis motor 93. Z-axis position sensor 94 detects the lifting and lowering position of lifting and lowering section 91. Further, contact-detecting sensor 95, configured with an optical axis sensor, is fixed to the upper face of lifting and lowering section 91, and contact-detecting sensor 95 ascends and descends as lifting and lowering section 91 ascends and descends.

Lifting and lowering section 91 includes engagement groove 96 formed toward head main body 33. Engagement groove 96 is a groove through which engagement piece 111 provided on holder 34 can pass when holder 34 revolves around the R-axis as head main body 33 rotates. Head main body 33 rotates around the R-axis while all holders 34 are urged upward by springs 36. At this time, all engagement pieces 111 are disposed at positions corresponding to engagement grooves 96 in the Z-axis direction, and when holder 34 revolves around the R-axis with the rotation of head main body 33, engagement pieces 111 pass through engagement grooves 96.

When head main body 33 is indexed to an indexing angle, the circumferential position of one holder 34 along the periphery of the R-axis coincides with the circumferential position of lifting and lowering section 91 along the periphery of the R-axis and engagement piece 111 provided in one holder 34 enters engagement groove 96. When Z-axis driving device 90 lowers lifting and lowering section 91 while one engagement piece 111 enter engagement groove 96, engagement piece 111 is pushed down while engaging with engagement groove 96, and holder 34 descends together with the lowering of lifting and lowering section 91.

3. Control Device 200

Next, control device 200 will be described with reference to FIG. 3. As shown in FIG. 3, control device 200 mainly includes a CPU, various types of memory, and the like. Control device 200 includes storage device 210, image processing device 220, mounting control section 230, and input/output interface 240. Storage device 210, image processing device 220, mounting control section 230, and input/output interface 240 are connected to each other via bus 250.

Detection signals from various motors of XY robot 31, detection signals from various motors and various sensors of mounting head 32, image signals from component camera 41 and board camera 42, and the like are inputted into control device 200 via input/output interface 240. Control signals and the like are outputted from image processing device 220 and mounting control section 230 to board conveyance device 10, component supply device 20, the various motors of XY robot 31, the various motors and various sensors of mounting head 32, component camera 41, and board camera 42 via input/output interface 240.

Storage device 210 is configured by an optical drive device such as a hard disk drive, flash memory, or the like. Storage device 210 stores control programs, control information, images obtained through imaging with component camera 41 and board camera 42, information obtained from the images, and the like. Image processing device 220 acquires images captured by component camera 41 and board camera 42, and executes image processing in accordance with applications.

Mounting control section 230 controls positions and rotation angles of mounting head 32 and component holding sections 35. Specifically, mounting control section 230 inputs information outputted from the various motors, the various sensors, and the like, the results of various recognition processes, and the like. Mounting control section 230 then outputs control signals to board conveyance device 10, component supply device 20, and component transfer device 30 based on the control programs and control information stored in storage device 210, information from the various sensors, and the results of image processing and recognition processing.

Further, mounting control section 230 includes contact determination section 231 which determines whether component P held by component holding section 35 contacts board K. Contact determination section 231 includes contact-detecting sensor 95 that detects whether component P held by component holding section 35 contacts board K. When contact-detecting sensor 95 detects that component P is in contact with board K, contact-detecting sensor 95 outputs a detection signal. When contact determination section 231 determines that component P held by component holding section 35 has come in contact with board K based on the detection signal outputted from contact-detecting sensor 95, mounting control section 230 controls Z-axis driving device 90 or the like so that component P is appropriately pressed against board K.

4. Configuration of Holder 34

Next, the configuration of holder 34 will be described with reference to FIG. 4. In FIG. 4, a portion of holder 34 to which an air supply device (not shown) for supplying air to component holding section 35 is connected is omitted. As shown in FIG. 4, holder 34 mainly includes syringe 110, first displacement portion 120, first urging portion 130, second displacement portion 140, and second urging portion 150.

Syringe 110 is a portion that can be displaced in the Z-axis direction in together with the lifting and lowering of lifting and lowering section 91. Syringe 110 has a cylindrical shape, and component holding section 35 is detachably mounted to the lower end of syringe 110. Engagement piece 111 protruding radially outward is formed on the upper portion of syringe 110. Engagement piece 111 is a portion that is engaged with engagement groove 96 provided in lifting and lowering section 91 when holder 34 is lifted and lowered, and each holder 34 is disposed with engagement piece 111 directed toward the side of head main body 33 (see FIG. 2). When lifting and lowering section 91 descends, the upper face of engagement piece 111 is pushed down by lifting and lowering section 91 and holder 34 descends. On the other hand, when lifting and lowering section 91 rises, holder 34 is urged upward by spring 36 and rises.

The inner peripheral surface of syringe 110 includes small diameter portion 113 in the upper portion of syringe 110, large diameter portion 112 below small diameter portion 113 with an inner diameter larger than small diameter portion 113, and step portion 114 at the connection between the lower end of small diameter portion 113 and the upper end of large diameter portion 112.

First displacement portion 120 is a cylindrical portion accommodated in large diameter portion 112 of syringe 110. First displacement portion 120 is provided so as to be displaceable in the vertical direction with respect to syringe 110, and the lower end of first displacement portion 120 contacts the upper end face of component holding section 35. First urging portion 130 is a spring accommodated in large diameter portion 112, and the lower end of first urging portion 130 is supported by the upper end face of first displacement portion 120. The outer diameter of first urging portion 130 is larger than the inner diameter of small diameter portion 113, and the upper end of first urging portion 130 is locked to step portion 114. First urging portion 130 is accommodated between step portion 114 and first displacement portion 120 in a compressed state, and first displacement portion 120 is urged downward by first urging portion 130. When component holding section 35 is pushed upward from the lower side, component holding section 35 and first displacement portion 120 are displaced upward with respect to syringe 110 while compressing first urging portion 130.

Second displacement portion 140 is provided separately from first displacement portion 120, Second displacement portion 140 includes shaft portion 141, engaging portion 142, and target detection portion 143. Shaft portion 141 is a rod-shaped portion that can be inserted into syringe 110. Engaging portion 142 is a portion formed at the lower end of shaft portion 141. The outer diameter of engaging portion 142 is larger than the outer diameter of shaft portion 141 and is set to a size that can be inserted into first displacement portion 120.

An annular restricting portion 121 protruding radially inward is formed on the inner peripheral surface of first displacement portion 120. The inner diameter of restricting portion 121 is set to be larger than the outer diameter of shaft portion 141 but smaller than the outer diameter of engaging portion 142. Shaft portion 141 is inserted into restricting portion 121, and engaging portion 142 is positioned below restricting portion 121. Therefore, when second displacement portion 140 rises while engaging portion 142 and restricting portion 121 are in contact with each other, engaging portion 142 engages with restricting portion 121 and first displacement portion 120 rises together with the rising of second displacement portion 140.

Target detection portion 143 is a disk-shaped portion provided at the upper end of shaft portion 141. Target detection portion 143 is positioned above syringe 110, and the outer diameter of target detection portion 143 is set to a dimension larger than at least the inner diameter of small diameter portion 113 of syringe 110. Second urging portion 150 is a spring disposed in a compressed state between the upper face of syringe 110 and the lower face of target detection portion 143, and target detection portion 143 is pushed upward with respect to syringe 110 by the urging force applied by second urging portion 150.

The downward urging force by first urging portion 130 is larger than the upward urging force by second urging portion 150, and in the state shown in FIG. 4, second displacement portion 140 is urged downward while engaging portion 142 is engaged with restricting portion 121.

In this manner, first urging portion 130 urges engaging portion 142 downward with respect to syringe 110 via first displacement portion 120, and second urging portion 150 urges target detection portion 143 upward with respect to syringe 110. As a result, second displacement portion 140 is positioned with respect to syringe 110 and first displacement portion 120 even if second displacement portion 140 is separate from syringe 110 and first displacement portion 120. When syringe 110 moves up and down together with lifting and lowering of lifting and lowering section 91, first displacement portion 120 and second displacement portion 140 move up and down together with syringe 110.

5. Operation of Holder

Next, with reference to FIG. 5, the operation of holder 34, when component P held by component holding section 35 contacts board K and thereafter component P is pressed against board K, will be described. On the left side of FIG. 5, holder 34 is shown at the moment component P comes in contact with board K, in other words, holder 34 just before component P is pressed against board K.

At this time, first displacement portion 120 and component holding section 35 are urged downward with respect to syringe 110 by first urging portion 130, while second displacement portion 140 is urged upward with respect to syringe 110 by second urging portion 150. As a result, a state in which engaging portion 142 of second displacement portion 140 and restricting portion 121 of first displacement portion 120 are engaged with each other in the vertical direction is maintained. Therefore, while component P and board K are not in contact with each other, first displacement portion 120 and second displacement portion 140 are displaced in the vertical direction together with syringe 110 as syringe 110 moves up and down. In this case, the length of first urging portion 130 is D1, and the length of second urging portion 150 is D2.

Figure 5:
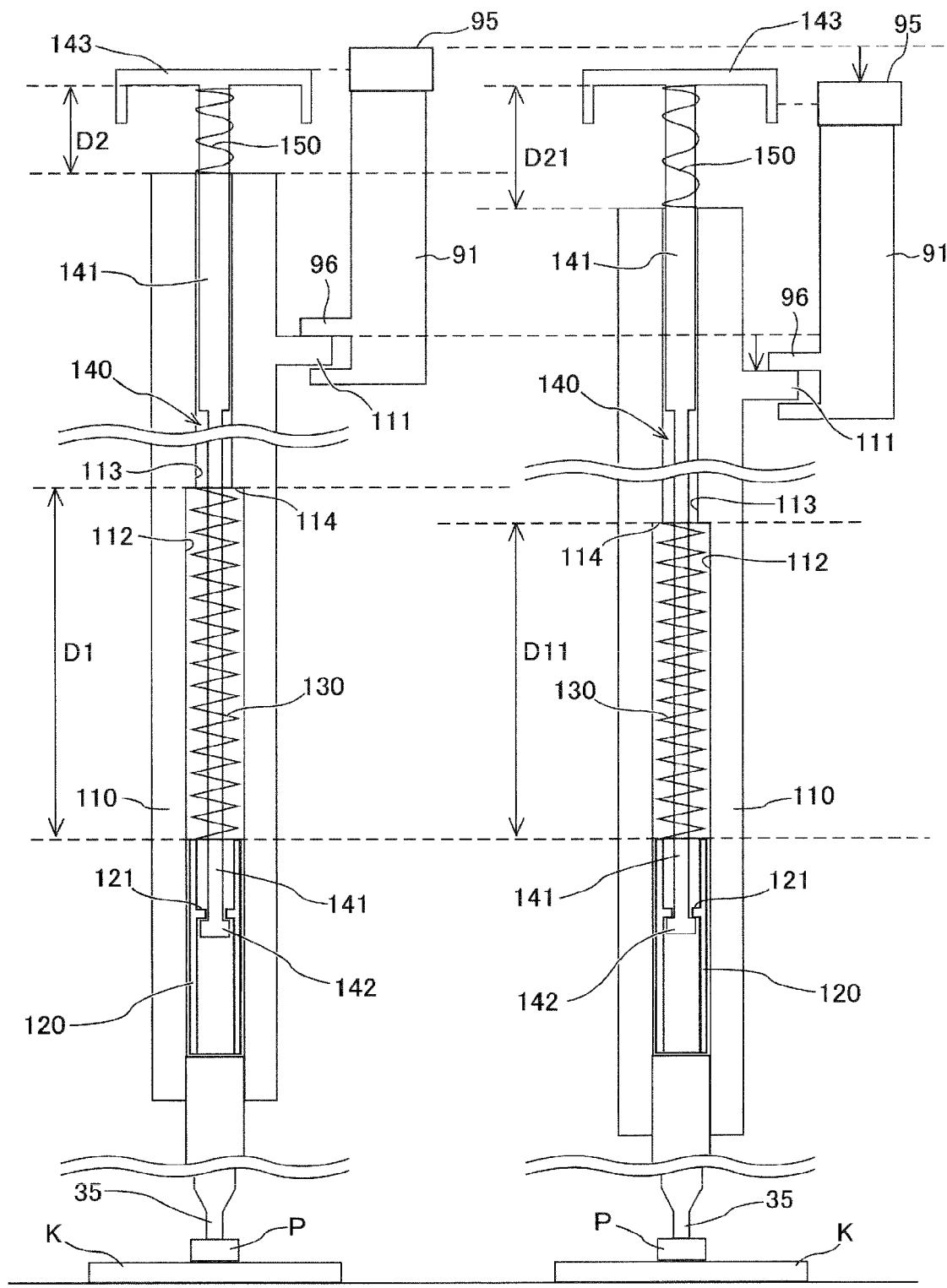
FIG. 5 A diagram showing an operation of the holder when mounting components, held in the component holding section, to the board.

On the right side of FIG. 5, holder 34 is shown when engagement piece 111 is further pushed down by lifting and lowering section 91, see FIG. 2, from the state shown on the left side of FIG. 5. Since the downward displacement of component holding section 35 and first displacement portion 120 is restricted while component P and board K are in contact with each other, when syringe 110 is pushed downward in this state, syringe 110 is displaced downward relative to component holding section 35 and first displacement portion 120. Accordingly, first urging portion 130 accommodated between step portion 114 and first displacement portion 120 is compressed, and length D11 of first urging portion 130 is shorter than length D1 before component P and board K come in contact with each other.

On the other hand, since first displacement portion 120 and second displacement portion 140 are provided separately from each other, second displacement portion 140 can be displaced downward following the descent of syringe 110. Therefore, second displacement portion 140 is momentarily displaced downward with respect to first displacement portion 120, and engaging portion 142 is in a state away from restriction portion 121. In this manner, since second displacement portion 140 is provided separately from first displacement portion 120, holder 34 can prevent a load based on the mass of second displacement portion 140 from being applied to component P at the time of contact between component P and board K.

At this time, when engaging portion 142 is separated from restricting portion 121 and the engagement between engaging portion 142 and restricting portion 121 is released, second urging portion 150 urges target detection portion 143 upward with respect to syringe 110. As a result, second displacement portion 140 is displaced upward with respect to first displacement portion 120, and a state in which engaging portion 142 is engaged with restricting portion 121 is restored. Length D21 of second urging portion 150 is longer than length D2 before component P and board K came in contact with each other.

Target detection portion 143 is displaced upward with respect to contact-detecting sensor 95 displaced integrally with syringe 110, and the displacement of target detection portion 143 is detected by contact-detecting sensor 95.

In this manner, holder 34 is provided such that second displacement portion 140 can be displaced in the vertical direction with respect to syringe 110, and when syringe 110 is pushed down while component P and board K are in contact with each other, target detection portion 143 rises with respect to syringe 110. When contact-detecting sensor 95 fixed to lifting and lowering section 91 detects the displacement of target detection portion 143 with respect to syringe 110 in the vertical direction, contact determination section 231 (see FIG. 3) determines that component P held by component holding section 35 has come in contact with board K.

As described above, in component mounting device 1, contact-detecting sensor 95 can be disposed above component holding section 35 to make controlling in order to avoid interference between component P mounted on board K and contact-detecting sensor 95 unnecessary. In this way, component mounter 1 can efficiently perform the mounting work of mounting component P.

Further, component mounting device 1 uses an optical axis sensor as contact-detecting sensor 95, and contact-detecting sensor 95 is disposed at the same height as target detection portion 143 in the Z-axis direction. In this case, component mounting device 1 can shorten the time required from the moment of contact between component P and board K to the moment contact-detecting sensor 95 detects the displacement of target detection portion 143. Therefore, component mounting machine 1 can easily control the pressurizing force applied to component P when component P is mounted on board K.

Further, second displacement portion 140 is provided separately from first displacement portion 120. At the same time, first displacement portion 120 is urged downward with respect to syringe 110 by first urging portion 130, and second displacement portion 140 is urged upward with respect to syringe 110 by second urging portion 150. Therefore, when syringe 110 is moved up and down while component P held by component holding section 35 is not in contact with board K, first displacement portion 120 and second displacement portion 140 are integrally displaced in the vertical direction as syringe 110 is moved up and down.

On the other hand, when component P held by component holding section 35 comes into contact with board K, second displacement portion 140 is displaced downward with respect to first displacement portion 120. Thus, holder 34 can prevent a load caused by the mass of second displacement portion 140 from being applied to component P when component P held by component holding section 35 comes in contact with board K. Therefore, even when second displacement portion 140 is enlarged by positioning target detection portion 143 above syringe 110, holder 34 can suppress component P from being damaged by the impact applied to component P at the time of contact with board K.

Eight holders 34 are provided in head main body 33 while contact-detecting sensor 95 is provided in lifting and lowering section 91. In this case, since it is unnecessary for component mounting device 1 to provide the same number of contact-detecting sensors 95 as holders 34, component costs can be suppressed.

6. Other

Although the component mounting machine disclosed in the present specification has been described based on the above embodiment, the present disclosure is not limited to the above embodiment, and it can be easily inferred that various modifications and improvements can be made within a scope not departing from the spirit of the present disclosure.

For example, in the above embodiment, as a component mounting machine using the technique disclosed in this specification, component mounting machine 1 in which head main body 33 is a rotary head and head main body 33 is provided with multiple holders 34 was described as an example, but the present disclosure is not limited thereto. That is, the technique disclosed in this specification may be applied to a component mounting machine in which only one holder 34 is provided in head main body 33.

In the above embodiment, a case where a spring is used as second urging portion 150 has been described as an example, but the present disclosure is not limited thereto. For example, instead of urging target detection portion 143 upward with respect to syringe 110 with the urging force of a spring, holder 34 may urge target detection portion 134 upward with respect to syringe 110 by using air-blowing, magnetic force of a magnet, or the like.

REFERENCE SIGNS LIST

1: Electronic component mounting machine (Component mounting machine), 31: XY robot (Head driving device), 33: Head main body, 34: Holder, 35: Component holding section, 95: Contact-detecting sensor, 110: Syringe, 120: First displacement portion, 130: First urging portion, 140: Second displacement portion, 142: Engaging portion, 143: Target detection portion, 150: Second urging portion, 231: Contact determination section, K: Circuit board (Board), P: Electronic component (Component)

The invention claimed is:

1. An electronic component mounting machine, configured to pick up a supplied electronic component and mount the electronic component on a conveyed circuit board, comprising:
a head main body,
a lifting and lowering section configured to move up and down with respect to the head main body,
a holder configured to move up and down with respect to the head main body as the lifting and lowering section moves up and down,
a component holding section configured to be attached to the holder and to hold the electronic component, and
a contact determination section configured to determine whether the electronic component, being held by the component holding section, has come in contact with the circuit board,
wherein the holder comprises:
a syringe configured to move up and down as the lifting and lowering section moves up and down,
a first displacement portion configured to move up and down with respect to the syringe and to which the component holding section is attached,
a first urging portion configured to urge the first displacement portion downward with respect to the syringe,
a second displacement portion, being provided separately from the first displacement portion, which is configured to move up and down with respect to the syringe and the first displacement portion, and
a second urging portion configured to urge the second displacement portion upward with respect to the syringe;
wherein the second displacement portion comprises:
an engaging portion configured to engage the first displacement portion urged downward by the first urging portion in a vertical direction, and
a target detection portion coupled to the engaging portion and disposed above the syringe,
wherein forces of the first urging portion and the second urging portion are collinear with a longitudinal axis of the syringe,
wherein the lifting and lowering section engages the syringe between the first urging portion and the second urging portion, and
wherein the contact determination section includes a contact-detecting sensor, being disposed above the lifting and lowering section, which is configured to detect displacement of the target detection portion with respect to the syringe, and the contact determination section determines that the electronic component has contacted the circuit board when displacement of the target detection portion is detected with the contact-detecting sensor.

2. The electronic component mounting machine of claim 1,
wherein the head main body is a rotary head that is indexed to multiple indexing angles by rotating about an axis parallel to the vertical direction,
wherein multiple holders are provided in the rotary head, and
wherein the contact-detecting sensor is provided in the lifting and lowering section.

3. The electronic component mounting machine of claim 2,
wherein the electronic component mounting machine includes a head driving device configured to move the head main body in a direction perpendicular to the vertical direction, and
wherein the rotary head is detachable from the head driving device.

4. An electronic component mounting method comprising: providing an electronic component mounting machine configured to pick up a supplied electronic component and mount the electronic component on a conveyed circuit board, the electronic component mounting machine comprising:
a head main body, a lifting and lowering section configured to move up and down with respect to the head main body, a holder configured to move up and down with respect to the head main body as the lifting and lowering section moves up and down, a component holding section configured to be attached to the holder and to hold the electronic component, and a contact-detecting sensor disposed above the lifting and lowering section;

wherein the holder comprises:

a syringe configured to move up and down as the lifting and lowering section moves up and down, a first displacement portion configured to move up and down with respect to the syringe and to which the component holding section is attached, a first urging portion configured to urge the first displacement portion downward with respect to the syringe, a second displacement portion, being provided separately from the first displacement portion, which is configured to move up and down with respect to the syringe and the first displacement portion, and a second urging portion configured to urge the second displacement portion upward with respect to the syringe;

wherein the second displacement portion comprises:

an engaging portion configured to engage the first displacement portion urged downward by the first urging portion in a vertical direction, and a target detection portion coupled to the engaging portion and disposed above the syringe, wherein forces of the first urging portion and the second urging portion are collinear with a longitudinal axis of the syringe, wherein the lifting and lowering section engages the syringe between the first urging portion and the second urging portion, and determining that an electronic component has come in contact with the circuit board when the contact-detecting sensor detects displacement of the target detection portion with respect to the syringe.

\* \* \* \* \*